United States Patent [19]

Garuts

[11] Patent Number: 4,719,447

[45] Date of Patent: Jan. 12, 1988

[54] ANALOG-TO-DIGITAL CONVERTER WITH PUSH-PULL INPUT SIGNAL CONFIGURATION

[75] Inventor: Valdis E. Garuts, Beaverton, Oreg.

[73] Assignee: Tektronix, Inc., Beaverton, Oreg.

[21] Appl. No.: 12,755

[22] Filed: Feb. 9, 1987

[51] Int. Cl.$^4$ ............................................. H03M 1/36
[52] U.S. Cl. ............................................. 340/347 AD
[58] Field of Search ................ 340/347 AD, 347 SH, 340/347 C

[56] References Cited

U.S. PATENT DOCUMENTS

| | | | |
|---|---|---|---|
| 3,017,626 | 1/1962 | Muller | 340/347 AD |
| 3,445,839 | 5/1969 | Engelberg | 340/347 AD |
| 3,829,853 | 8/1974 | Freedman | 340/347 AD |
| 3,877,025 | 4/1975 | Maio | 340/347 AD |

*Primary Examiner*—Charles D. Miller
*Attorney, Agent, or Firm*—Paul S. Angello; Robert S. Hulse

[57] ABSTRACT

The present invention provides a parallel or "flash" analog-to-digital converter circuit (A) including a plurality of voltage comparators (20a–20g) arranged in first and second sets (F and E) adapted for receiving separate analog input signals. A push-pull configuration is employed in providing the analog input signal to the comparators of the two sets. The analog inputs (22a–22d) of the comparators (20a–20d) in the first set are provided in input signal $V_1$ and the analog inputs (22e–22g) of the comparators (20e–20g) in the second set are provided an input signal $V_2$ of equal magnitude but opposite polarity. Different reference voltages are provided to the reference inputs (24a–24g) of the comparators by a series-connected resistor network (H). Two encoders (I and J) and an adder (K) are used to detect the number of output signals from the comparators in a similar logic state and provide a digital binary output signal corresponding to the number of such outputs. The present invention can be implemented in an alternative embodiment (L) that includes a source (M) of constant voltage which offsets the amplitude of one of the input signals $V_1$ or $V_2$. This enables the use of a simplified resistor network (N) that provides reference voltages which can be applied to reference inputs of comparators in both sets. The present invention can also be implemented advantageously as an integrated circuit of compact layout that minimizes cross talk among signals flowing through the circuit and thereby enhances the precision thereof.

12 Claims, 5 Drawing Figures

ANALOG-TO-DIGITAL CONVERTER WITH PUSH-PULL INPUT SIGNAL CONFIGURATION

TECHNICAL FIELD

The present invention relates to analog-to-digital converters and, in particular, to a parallel or "flash" analog-to-digital converter that provides a digital word which represents with high precision the amplitude of an analog input signal.

BACKGROUND OF THE INVENTION

One type of analog-to-digital converter, commonly referred to as a parallel or "flash" analog-to-digital converter, employs a group of voltage comparators, each of which has an analog signal input and a voltage reference input. The analog signal inputs of the comparators are electrically connected together to provide a single-ended input configuration. The reference voltage inputs receive reference voltages from a series-connected resistor network. The comparators provide output signals which form a "thermometer" code corresponding to the amplitude of the input signal. The thermometer code is then encoded into a digital signal having a binary format.

An analog-to-digital converter is fabricated typically as an integrated circuit. A flash analog-to-digital converter of the integrated circuit type that employs a single-ended input configuration uses the substrate as the primary return path for the input signal currents. The application of the same analog input signal to all of the comparators causes capacitive injection of substantial noise currents into the substrate. These noise currents can cause unacceptable levels of cross talk among the different circuits comprising portions of and the signals flowing within the integrated circuit. The presence of noise currents reduces the precision of the analog-to-digital converter. Significant amounts of return signal currents also flow through the reference voltage and power supply circuitry. Consequently, to ensure proper operation of the circuit, it is necessary that each of the return current paths have a low impedance connection to the analog input signal source ground. Such low impedance return connections are, however, difficult to achieve.

SUMMARY OF THE INVENTION

An object of the present invention is to provide a parallel or "flash" analog-to-digital converter that produces a digital output word which corresponds with high precision to the amplitude of an analog input signal.

Another object of this invention is to provide such an analog-to-digital converter that has improved suppression of noise currents.

A further object of this invention is to provide such an analog-to-digital converter in a configuration that reduces or eliminates the need for low impedance return current connections to the analog input signal source ground.

Still another object of this invention is to provide such an analog-to-digital converter that is suitable for fabrication as an integrated circuit.

The present invention constitutes an analog-to-digital converter which receives an analog signal and develops input signals of equal magnitude but opposite polarity that are applied in push-pull fashion to different sets of comparators. The circuit includes input circuitry for developing and processing the input signals; first and second separate sets of comparators, each comparator having an analog input, a reference input, and an output; a common series-connected resistor network; and output circuitry such as two encoders and a digital adder.

The input circuitry receives the analog input signal and develops suitable first and second analog input signals of equal magnitude but opposite polarity. The first input signal is applied to the analog inputs of the first set of comparators, and the second input signal is applied to the analog inputs of the second set of comparators. The common resistor network provides a series of different reference voltages which are applied to the reference inputs of the comparators. Each comparator provides an output signal in a high or low voltage state representing the comparative relationship of the analog input signal and reference voltage present on its inputs. The outputs of the comparators in each set form separate digital thermometer codes corresponding to the voltage level of the analog signal. The encoders detect the number of outputs in the same voltage state (e.g. high voltage) provided by each set of comparators and develop binary signals corresponding to these numbers which are summed by the adder to generate the desired binary output word.

In a preferred embodiment, the analog and reference inputs to one of the sets of comparators are noninverting and inverting, respectively, while the analog and reference inputs to the other set are inverting and noninverting, respectively. The foregoing arrangement assists in providing complementary functioning between the different sets of comparators.

In an alternative preferred embodiment, a voltage source provides a constant voltage that offsets the analog input signal applied to one of the sets of comparators. This voltage offset facilitates the use of a simplified common resistor network that can be constructed with fewer resistors, and, consequently, with fewer electrical connections, than those required in the other preferred embodiment.

When implemented as an integrated circuit in a suitable physical layout, the analog-to-digital converter of the present invention confines the injection of equal and opposite noise currents to small areas in the integrated circuit. This reduces cross talk among other signals flowing through the integrated circuit. This circuit also reduces the net noise current introduced into the substrate and power supply connections and, as a consequence, reduces or eliminates the need for very low impedance connections between the signal source and the ground conductors, the reference signal source, and the power supply. The reduction in noise currents provides an analog-to-digital converter of high precision.

Additional objects and advantages of the present invention will be apparent from the following detailed description of preferred embodiments thereof, which proceeds with reference to the accompanying drawings.

DETAILED DESCRIPTION OF PREFERRED EMBODIMENTS

Figure 1:
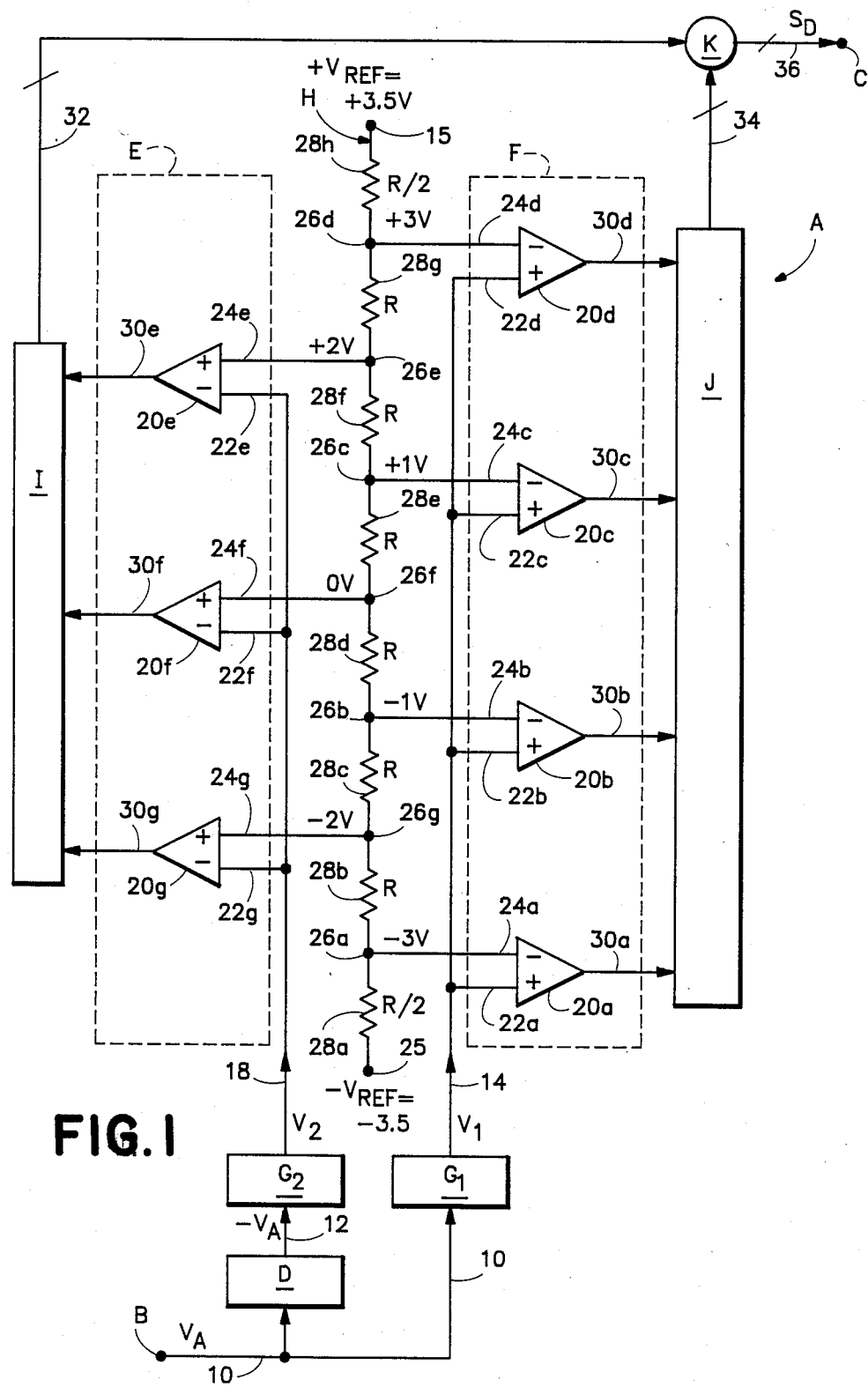
FIG. 1 is a schematic diagram of the electrical circuitry for a preferred embodiment of the analog-to-digital converter of the present invention.

Referring now to FIG. 1, the general operation of converter circuit A of the present invention may be outlined as follows. The converter circuit A receives an analog input signal at an input terminal B and provides a corresponding binary output word at an output terminal C. The analog input signal is supplied through an inverter D to a set E of comparators and directly to a set F of comparators. The output signal of inverter D and the analog input signal are of equal magnitude but opposite polarity. These signals may undergo optional processing by separate signal processors $G_1$ and $G_2$ before they are applied to the comparators. The comparators in both sets E and F are furnished with reference voltages from a common series-connected resistor network H. The comparators in sets E and F provide separate digital thermometer code outputs to respective encoders I and J. The encoders I and J provide binary output signals corresponding to the number of comparator outputs supplied to them in a similar (e.g., high voltage) state. The output signals from the encoders I and J are summed by an adder K to form the desired binary output word at the output terminal C.

Reviewing the construction of the converter circuit A of FIG. 1 in greater detail, the inverter D receives an instantaneously variable continuous analog input signal $V_A$ on a line 10 from the terminal B and provides on a line 12 a signal $-V_A$. Each of the signal procesors $G_1$ and $G_2$ may comprise, for example, an optional sample-and-hold circuit which samples at regular time intervals the signal applied to its input and supplies a periodically variable output coresponding to the amplitude of the input signal at the start of each sampling period. The signal processor $G_1$ receiving the signal $V_A$ provides an output signal $V_1$ on a line 14 to the comparators of the set F. The signal processor $G_2$ receiving the signal $-V_A$ provides an output signal $V_2$ on a line 18 to the comparators of the set E.

The sets E and F together contain seven voltage comparators 20a–20g of similar design. The seven voltage comparators provide, by way of example only, a 3-bit converter circuit A. Skilled persons would appreciate that analog-to-digital converters having a different number of output bits can be implemented in accordance with the present invention. The set E includes the comparators 20e–20g, and the set F includes the comparators 20a–20d. The comparators 20e–20g in set E have respective analog inputs 22e–22g, reference inputs 24e–24g, and logic outputs 30e–30g. The comparators 20a–20d in set F have respective analog inputs 22a–22d, reference inputs 24a–24d, and logic outputs 30a–30d. The comparators 20a–20g compare the signals provided at their analog inputs 22a–22g with the reference voltage signals provided at their reference inputs 24a–24g, and each comparator 20a–20g provides on its respective output 30a–30g a logic signal representative of the relationship between the voltage levels at its inputs.

With respect to set E, analog inputs 22e–22g are the inverting inputs of the respective comparators 20e–20g and are electrically connected to the line 18 which forms a common line that delivers the signal $V_2$ to all the comparators in set E. Reference inputs 24e–24g are the noninverting inputs of the respective comparators 20e–20g and are electrically connected to and receive different DC reference voltages from the junction nodes 26e–26g of the resistor network H which will be described hereinafter in greater detail. Each of the comparators 20e–20g in the set E provides a logic 1 or high voltage output signal whenever the voltage of its analog input signal $V_2$ is less than the reference voltage from the one of junction nodes 26e–26g to which it is connected, and otherwise provides a logic 0 or low voltage output signal.

With respect to set F, analog inputs 22a–22d are the noninverting inputs of the respective comparators 20a–20d and are electrically connected to the line 14 which forms a common line that delivers the signal $V_1$ to all the comparators in set F. Reference inputs 24a–24d are the inverting inputs of the respective comparators 20a–20d and are electrically connected to and receive different DC reference voltages from the junction nodes 26a–26d of the resistor network H. Each of the comparators 20a–20d in the set F provides a logic 1 or high voltage output signal whenever the voltage of its analog input signal $V_1$ exceeds the reference voltage from the one of junction nodes 26a–26d to which it is connected, and otherwise provides a logic 0 or low voltage. output signal.

The resistor network H includes eight resistors 28a–28h connected in series and has DC supply voltages of $V_{REF} = +3.5$ V and $-V_{REF} = -3.5$ V applied to a positive input terminal 15 and a negative input terminal 25, respectively. The resistor network H provides seven junction nodes 26a–26g to which the reference inputs of the respective comparators 20a–20g are individually connected. The resistors 28a and 28h, which are directly connected to the respective input terminals 25 and 15, have resistance values of R/2=5,000 ohms. The other resistors 28b–28g have resistance values of R=10,000 ohms. Of course, the above values of the DC supply voltages and resistors are presented by way of example only and can be changed to accommodate a particular circuit application.

Since the comparators 20a–20g have high impedance inputs, the voltage drops across the resistors 28a and 28h are approximately equal to 0.5 volt and the voltage drops across the resistors 28b–28g are approximately equal to 1.0 volt. The resistor network H together with DC voltages $V_{REF}$ and $-V_{REF}$ applied to the terminals 15 and 25 provide, therefore, the reference voltages $-3$ V, $-1$ V, $+1$ V, and $+3$ V at the respective junction nodes 26a–26d and the reference voltages $+2$ V, 0 V, and $-2$ V at the respective junction nodes 26e–26g, respectively.

The outputs 30a–30d of the comparators 20a–20d of set F are connected to the encoder J, and the outputs of the comparators 20e–20g of set E are connected to the encoder I. The encoders I and J are conventional devices of the type frequently used with conventional flash analog-to-digital converters for registering the number of similar output signals from a group of comparators and supplying this number as a digital signal in binary format. The encoder I detects the number of logic 1 signals received from the comparators 20e–20g and provides a digital output on line 32 representing a binary number corresponding to the number of such similar comparator outputs. Similarly, the encoder J detects the number of logic 1 signals received from the comparators 20a-20d and provides a digital output on line 34 representing a binary number corresponding to the number of such similar comparator outputs. The lines 32 and 34 are connected to a conventional type digital binary signal adder K which functions to provide a digital output signal $S_D$ on line 36 (and at terminal C) corresponding to the arithmetic sum of the binary numbers represented by the digital signals received on the lines 32 and 34. the digital output signal $S_D$ represents the total number of logic 1 signals provided by the comparators 20a-20g within both sets E and F.

In operation, the conerter circuit A receives a continuously variable analog signal $V_A$ on line 10 from terminal B. The signal $V_A$ is directly applied to processor $G_1$, which provides the output signal $V_1$ on line 14 to the comparators 20a-20d of set F. The signal $V_A$ is also applied to inverter D to form on line 12 a signal $-V_A$ that is applied to processor $G_2$, which provides the output signal $V_2$ on line 18 to the comparators 20e-20g of set E. The comparators 20a-20d of set F receive the signal $V_1$ at their analog inputs 22a-22d from line 14 and reference voltages $-3$ V, $-1$ V, $+1$ V, $+3$ V at their reference inputs 24a-24d from the junction nodes 26a-26d of resistor network H. The comparators 20e-20g of set E receive the signal $V_2$ at their analog inputs 22e-22g from line 18 and the reference voltages $+2$ V, 0 V, $-2$ V at their reference inputs 24e-24g from the junction nodes 26e-26g of the resistor network H. Each of the comparators 20a-20d compares its analog input signal with its reference input voltage and produces a logic 1 or high voltage output signal whenever the voltage of the analog input signal $V_1$ exceeds the reference voltage. Each of the comparators 20e-20g compares its analog input signal with its reference input voltage and produces a logic 1 or high voltage output signal whenever the voltage of the analog input signal $V_2$ is less than the reference voltage.

However the comparators in sets E and F are supplied with the respective analog input signals $V_2$ and $V_1$ of opposite polarity. also, the reference and analog inputs of the different sets E and F are configured with their inverting and noninverting inputs opositely arranged. Consequently, the comparators 20e-20g and 20a-20d within the respective sets E and F function in different but complementary fashions.

Figure 2:
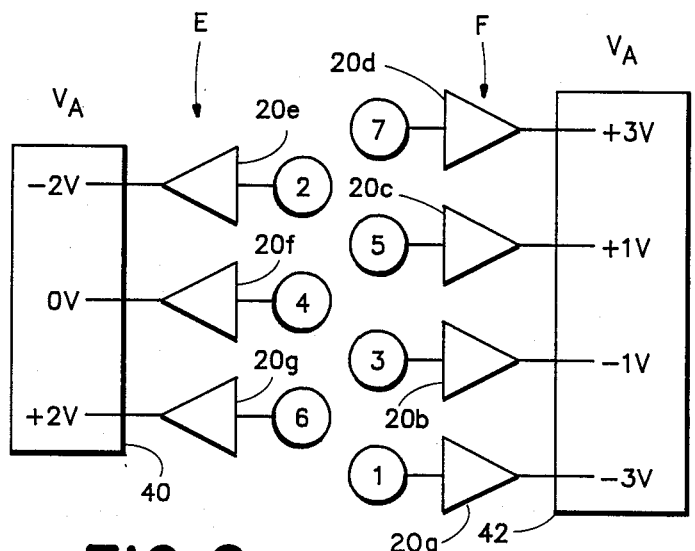
FIG. 2 is a diagram illustrating the operation of the comparators of the converter circuit of FIG. 1.

Referring now to FIG. 2, the sequence of operation of the comparators 20-20g is diagrammatically illustrated. the boses 40 and 42 include the voltage levels for the analog imput signal $V_A$ at which the which the levels are horizontally aligned toggle from one logic state to another. Each of the comparators 20a-20d provides a logic 1 output signal whenever the analog input signal $V_A$ is greater than the reference voltage level aligned with it and provides a logic 0 output signal whenever the analog input signal $V_A$ is equal to or less than the reference voltage level aligned with it. Each of the comparators 20e-20g provides a logic 1 output signal whenever the inverted analog input signal $-V_A$ is less than the reference voltage level aligned with it and provides a logic 0 output signal whenever the inverted analog input signal $-V_A$ is equal to or greater than the reference voltage level aligned with it. Consequently, for analog input signals uniformly increasing over the range $-3$ V to $+3$ V, the comparators toggle from logic 0 to logic 1 in the sequence—20a, 20e, 20b, 20f, 20c, 20g, 20d, as indicated by the circled numbers from 1 to 7. Conversely, for analog input signals uniformly decreasing over the range $+3$ V to $-3$ V, the comparators toggle from logic 1 to logic 0 in the reverse sequence—20d, 20g, 20c, 20f, 20b, 20e, 20a as indicated by the circled numbers from 7 to 1. The unique sequence in which the comparators 20a-20g toggle is the result of the sets E and F being supplied analog input signals of opposite (inverted) polarity and of the opposite arrangement of the inverting and noninverting inputs to the sets E and F.

Figure 3:
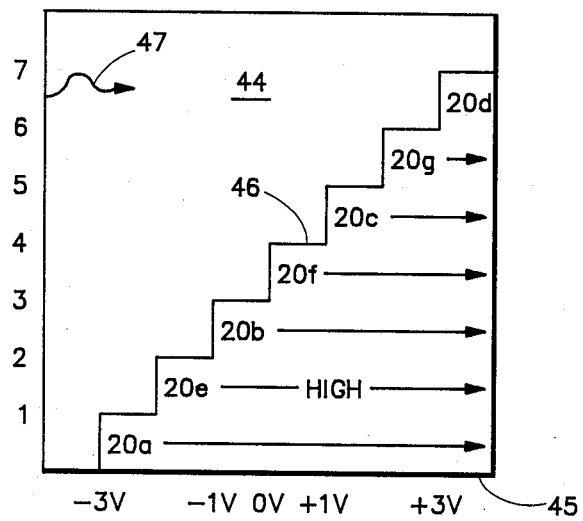
FIG. 3 is a graph which plots the number of comparators of the converter circuit of FIG. 1 in similar output states as a function of analog input voltage.

Over the voltage range $-3$ V to $+3$ V, the number of comparators providing logic 1 output signals is proportional in a stepwise fashion to the value of the voltage of the analog input signal $V_A$. Referring now to graph 44 of FIG. 3, the X-axis 45 represents the voltage level of the analog input signal $V_A$ and the Y-axis 47 represents the number of comparators providing logic 1 output signals. The line 46 plots the relationship between analog input voltage level and the number of comparators providing logic 1 output signals The individual comparators 20a-20g which are in the logic 1 (high voltage) state at each voltage level are indicated below the line 46 on the chart 44. As may be seen from the chart 44, the number of comparators 20a-20g in the logic 1 state is a stepwise linear function of the analog input signal voltage $V_A$. Further, since the digital output signal $S_D$ (through the action of the encoders I and J and adder K) represents the total number of comparators in the logic 1 state, the line 46 also plots the binary value of the digital output signal $S_D$. The binary value of the digital output signal $S_D$ can, therefore, also be seen to be a stepwise linear function of analog input signal $V_A$.

The present invention offers the following advantages over conventional analog-to-digital converters having single-ended input configurations. First, each of the sets E and F of comparators presents an input impedance which equals approximately twice that presented by the comparators in a single-ended input configuration. This higher input impedance reduces errors that result from a non-zero analog signal source impedance Second, for a fixed total input signal amplitude and a given amount of electrical power, the total resistance of the resistor network may be reduced by a factor of four for a given amount of electrical power. This reduces the voltage drop that results from the current flowing from the common resistor network H into the reference inputs of the comparators.

Figure 4:
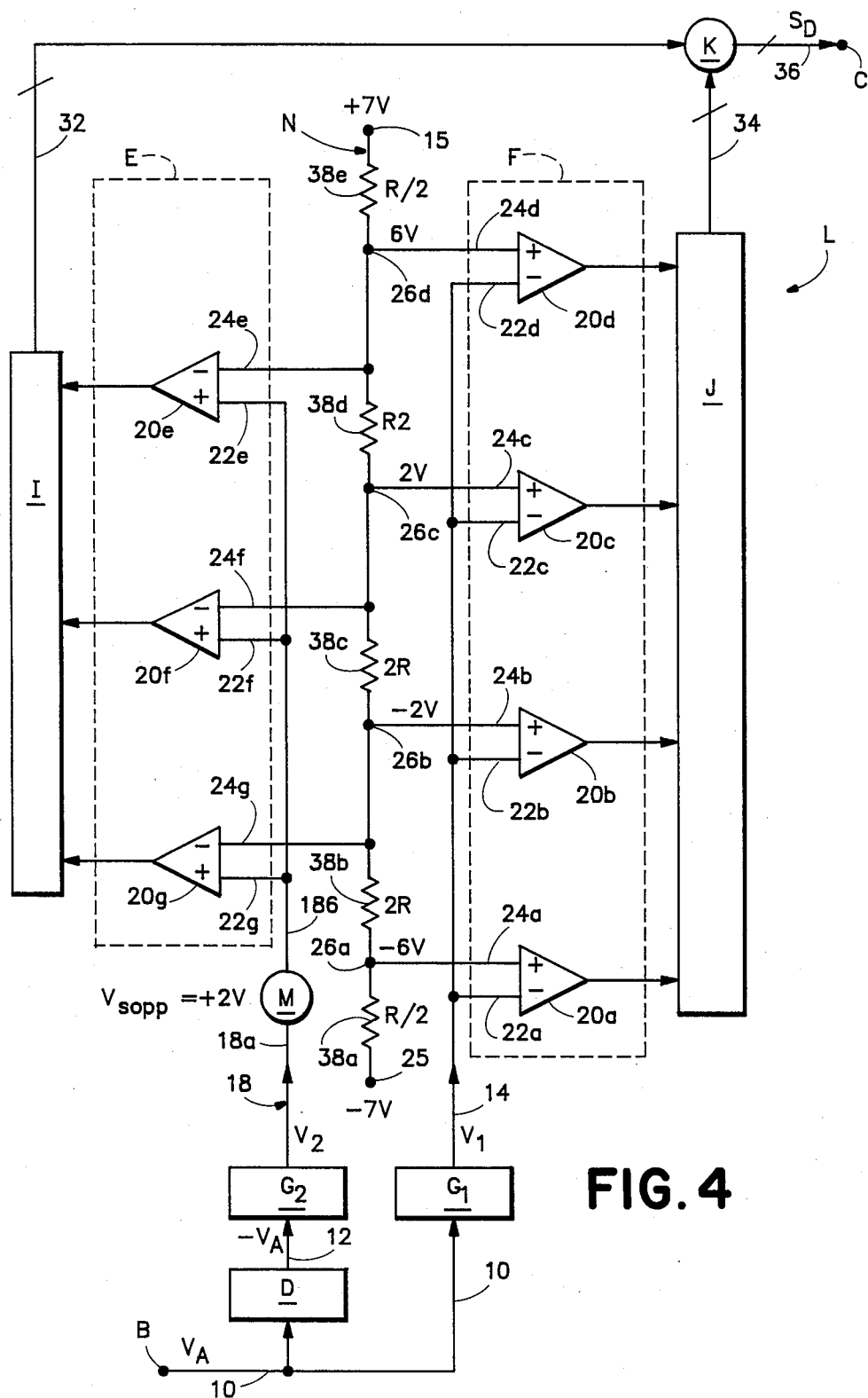
FIG. 4 is a schematic diagram of the electrical circuitry for an alternative preferred embodiment of the analog-to-digital converter of the present invention.

Referring now to FIG. 4, an alternative preferred embodiment of the present invention is shown in the form of the converter circuit L. The converter circuit L is very similar in structure and function to the converter circuit A of FIG. 1. As a matter of design choice, converter circuit L has DC voltages of $+7$ V and $-7$ V applied to the terminals 15 and 25 to give the converter circuit L a different range of operation with respect to the voltage of the analog input signal. The converter circuit L employs a voltage source M, such as a resistive voltage divider, connected between the processor $G_1$ and the analog inputs 22e-22g of the comparators 20e-20g of the set E. Further, a resistor network N has a structure different from the network H of converter circuit A for supplying reference voltages to the set E of comparators 20e-20g.

The voltage source M offsets the amplitude of output signal $V_2$ of the processor G provided on line 18a by a constant amount $V_{SUPP} = +2$ V (corresponding to one-half the voltage drop across each of the resistors 38b–38d) and provides an output signal $V_2+V_{SUPP}$ to the inputs 22e–22g of the respective comparators 20e–20g of set E on line 18b. The resistor network N includes five series-connected resistors 38a–38e. The resistors 38a and 38e, which are directly connected to the respective terminals 25 and 15, have resistance values of R/2=5,000 ohms; and the remaining resistors 38b–38d have resistance values of 2R=20,000 ohms. The resistor network provides the voltages −6 V, −2 V, +2 V, and +6 V at the respective junction nodes 26a–26d. The junction nodes 26b, 26c, and 26d are connected to, respectively, both the reference inputs 24b, 24c, and 24d of set F and the reference inputs 24g, 24f, and 24e of set E. The junction node 26a is connected to the reference input 24a of comparator 20a.

In operation, the voltage offset $V_{SUPP}$ results in the comparators 20e–20g of set E toggling with respect to the analog input signal $V_A$ at voltages levels displaced by 2 volts. The comparators 20e–20g effectively toggle at +4 V, 0 V, and −4 V instead of at the +6 V, +2 V, and −6 V levels provided by the junction nodes of the resistor network N. Accordingly, the resistor network N need not separately provide the reference voltages +4 V, 0 V, and −4 V. Only four junction nodes and five resistors are, therefore, required for the resistor network N of the converter circuit L to provide a 2 volt resolution over the range from +6V to −6V.

Figure 5:
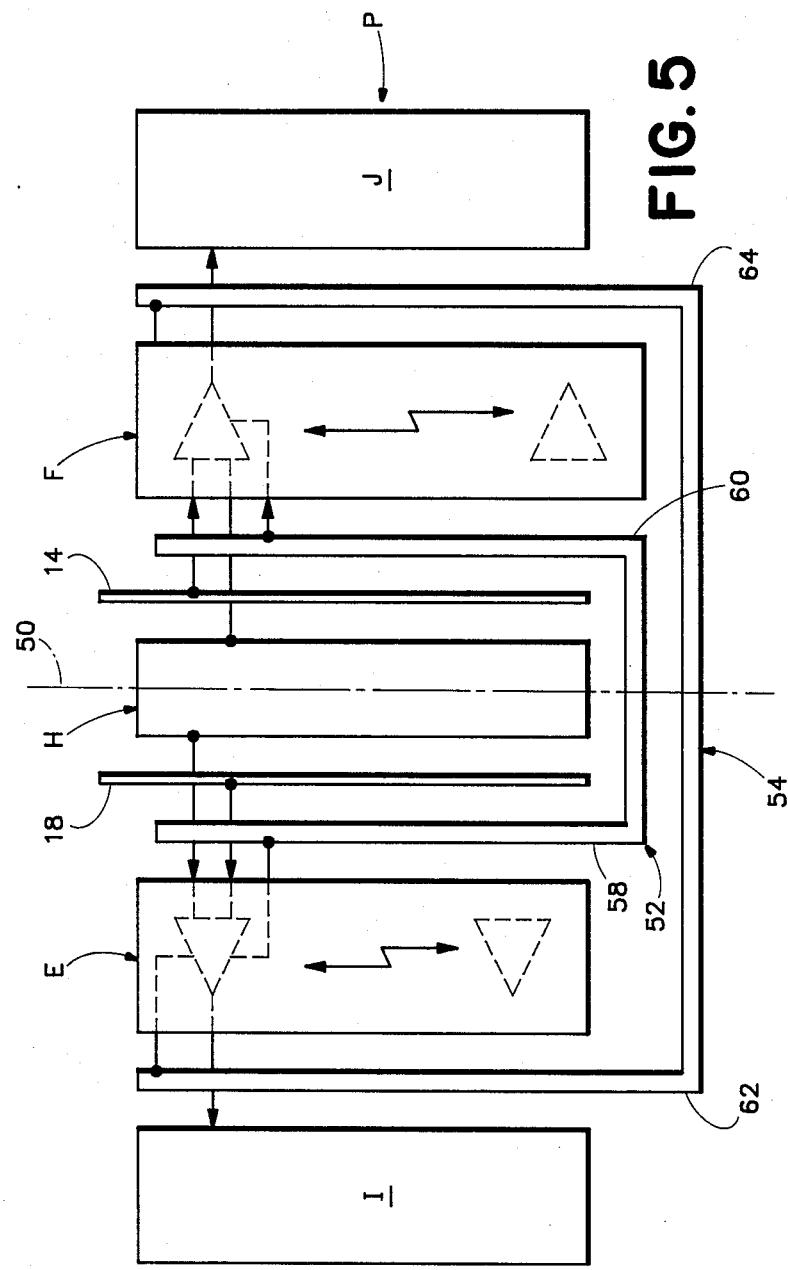
FIG. 5 is a diagram of a layout for the electrical circuitry of the present invention implemented as an integrated circuit.

Referring now to FIG. 5, a configuration P is shown for implementing the converter circuit of the present invention as a single integrated circuit. The configuration P includes resistor network H, analog input supply lines 14 and 18, power supply conductors 52 and 54, sets E and F of comparators, and encoders I and J. The resistor network H is centrally located and extends longitudinally along the center line 50. The sets E and F of comparators are disposed in longitudinally extending banks positioned along opposite lateral sides of the resistor network H. The encoders I and J are positioned exterior to the respective sets E and F of comparators, also along opposite lateral sides of the resistor network H. The analog input lines 14 and 18 for supplying the signals $V_1$ and $V_2$ extend longitudinally between the resistive network H and the sets F and E of comparators, respectively. The power supply conductor 52 includes two branches 58 and 60 which run longitudinally between the resistor network H and sets E and F of comparators, respectively, for furnishing ground connections for the comparators within the sets E and F. The power supply conductor 54 includes two branches 62 and 64 for supplying power to the comparators within the respective sets E and F. Branch 62 extends longitudinally between the set E of comparators and the encoder I, and branch 64 extends longitudinally between the set F of comparators and the encoder J.

The configuration P provides a symmetrical disposition of the components of the converter circuit of the present invention around the resistor network H which is compact in construction and which allows for efficient cancellation of currents generated by the circuit within the substrate of the integrated circuit. More specifically, the currents injected into the substrate by the input signal $V_1$ are of substantially equal magnitude and opposite polarity to those injected at nearby locations by the input signal $V_2$. There are, therefore, only small amounts of net noise current injected into the integrated circuit substrate. Further, the currents injected into resistor network H from the reference signal inputs to the comparators are also of substantially equal magnitude and opposite polarity at locations near to each other along the resistor network H.

Additionally, power supply conductor strips 50 and 52 are electrically connected to the comparators by short length conductors. Signal currents injected by the comparators into the power supply conductors are, therefore, confined to a small areas within the power supply terminals.

As may be apparent to those having skill in the art, many changes may be made in the above-described details of the embodiments of the present invention without departing from the underlying principles thereof. For example, the implementation of the encoders and the adder could be combined into a single, functionally equivalent unit. The scope of the present invention should be determined, therefore, only in accordance with the following claims.

I claim:

1. An analog-to-digital converter circuit, comprising:
   means for providing a first analog input signal and a second analog input signal of equal magnitude but opposite polarity;
   means for providing a plurality of different reference voltages;
   a first set of voltage comparators each of which has an analog input electrically connected to said means for providing input signals for receiving said first analog input signal, a reference input electrically connected to said means for providing reference voltages for receiving a reference voltage and an output for supplying an output signal representative of the comparative relationship between said first analog input signal and the reference voltage provided to each such comparator;
   a second set of voltage comparators each of which has an analog input electrically connected to said means for providing input signals for receiving said second analog input signal, a reference input electrically connected to said means for providing reference voltages for receiving a reference voltage, and an output for supplying an output signal representative of the comparative relationship between said second analog input signal and the reference voltage provided to each such comparator; and
   means electrically connected to the outputs of said comparators of said first and second sets for forming a digital output signal corresponding to the number of comparators providing related output signals.

2. The circuit of claim 1, wherein said means for providing reference voltages includes a series-connected resistor network.

3. The circuit of claim 1, wherein said means for providing analog input signals includes an inverter circuit for use in providing said second analog input signal.

4. The circuit of claim 1, wherein said analog and reference inputs to said first set of comparators are noninverting and inverting, respectively, and said analog and reference inputs to said second set of comparators are inverting and noninverting, respectively.

5. The circuit of claim 1, wherein said means for forming a digital signal includes:
   first encoding means electrically connected to said first set of comparators for forming a first digital signal corresponding to the number of comparators providing similar output signals in said first set;
   second encoding means electrically connected to said second set of comparators for forming a second digital signal corresponding to the number of comparators providing similar output signals in said second set; and adding means electrically connected to said first and second encoding means for summing the first and second digital signals produced by said first and second encoding means and forming a digital output signal corresponding to the total number of comparators providing similar output signals.

6. An analog-to-digital converter circuit, comprising:
a plurality of comparators each of which has an analog input, a reference input and an output for providing signals representative of the comparative relationship of signals supplied on said inputs, and which are arranged in a first set of comparators electrically connected to a first common input line and a second set of comparators electrically connected to a second common input line;

means for supplying an analog input signal to said first common input line, for inverting said analog input signal to form an inverted analog signal of equal magnitude but opposite polarity, and for supplying said inverted analog signal to said second common input line;

a resistor network for supplying different reference voltages to said reference inputs of said plurality of comparators; and means electrically connected to the outputs of said plurality of comparators for generating a digital signal corresponding to the number of comparators providing similar output signals.

7. The circuit of claim 6 further comprising offset means for offsetting the amplitude of one of said analog input or inverted analog signals, and wherein said resistor network supplies a different reference voltage to each of the comparators of one of said sets and to a comparator of the other one of said sets.

8. The circuit of claim 6, wherein the analog and reference inputs to said first set of comparators are noninverting and inverting, respectively, and the analog and reference inputs to said second set of comparators are inverting and noninverting, respectively.

9. The circuit of claim 8, wherein said means for generating a digital signal includes:
a first encoding means electrically connected to the outputs of said first set of comparators for generating a first digital signal corresponding to the number of such comparators providing similar output signals;
a second encoding means electrically connected to the outputs of said second set of comparators for generating a second digital signal corresponding to the number of such comparators providing similar output signals; and
adding means electrically connected to said first and second encoding means for summing said first and second digital signals to form a digital output signal corresponding to the total number of comparators having similar output signals.

10. A configuration for an analog-to-digital converter circuit as an integrated circuit, comprising:
a longitudinally extending and centrally located resistor network;
a first bank and a second bank of longitudinally extending comparators, said banks positioned along opposite lateral sides of said resistor network and adapted to receive analog input signals of equal magnitude but opposite polarity from separate first and second input lines running longitudinally alongside said first and second banks of comparators, respectively.

11. The configuration of claim 10, further including first and second encoders positioned along opposite lateral sides of said resistor network exterior to said banks of comparators.

12. A process for converting an analog signal to a digital signal comprising the steps of:
inverting said analog signal to form an inverted signal of equal magnitude but opposite polarity;
supplying said analog signal to a first set of comparators, said analog signal being supplied to inputs of a first polarity;
supplying said inverted signal to a second set of comparators, said inverted signal being supplied to inputs of a second polarity;
generating a plurality of different reference voltages through the use of a resistor network;
supplying a different one of said reference voltages to said first set of comparators, said reference voltages being supplied to inputs of said second polarity;
supplying a different one of said reference voltages to said second set of comparators, said reference voltages being supplied to inputs of said first polarity;
using said comparators to generate output signals representing the comparative relationships of said analog and inverted signals to said reference voltages; and
detecting the number of output signals of said comparators which are of a similar type and providing a digital binary output signal corresponding to said number.

* * * * *